(12) United States Patent
Kobayashi et al.

(10) Patent No.: US 9,401,381 B2
(45) Date of Patent: Jul. 26, 2016

(54) SOLID-STATE IMAGE PICKUP DEVICE

(71) Applicant: HAMAMATSU PHOTONICS K.K., Hamamatsu-shi, Shizuoka (JP)

(72) Inventors: Hiroya Kobayashi, Hamamatsu (JP); Masaharu Muramatsu, Hamamatsu (JP)

(73) Assignee: HAMAMATSU PHOTONICS K.K., Hamamatsu-shi, Shizuoka (JP)

(*) Notice: Subject to any disclaimer, the term of this patent is extended or adjusted under 35 U.S.C. 154(b) by 71 days.

(21) Appl. No.: 14/401,224

(22) PCT Filed: Mar. 13, 2013

(86) PCT No.: PCT/JP2013/057003
§ 371 (c)(1),
(2) Date: Nov. 14, 2014

(87) PCT Pub. No.: WO2013/172081
PCT Pub. Date: Nov. 21, 2013

(65) Prior Publication Data
US 2015/0130004 A1 May 14, 2015

(30) Foreign Application Priority Data
May 18, 2012 (JP) .................................. 2012-114331

(51) Int. Cl.
*H01L 27/146* (2006.01)
*H01L 31/0216* (2014.01)
*H01L 31/0232* (2014.01)

(52) U.S. Cl.
CPC ...... *H01L 27/1464* (2013.01); *H01L 27/14618* (2013.01); *H01L 27/14621* (2013.01);

(Continued)

(58) Field of Classification Search
None
See application file for complete search history.

(56) References Cited

U.S. PATENT DOCUMENTS

| 4,814,847 A | 3/1989 | Tabatabaie |
| 7,550,811 B2 * | 6/2009 | Kobayashi ............ H01J 37/224 257/431 |

(Continued)

FOREIGN PATENT DOCUMENTS

| JP | S57-106244 U | 6/1982 |
| JP | H05-303058 A | 11/1993 |

(Continued)

OTHER PUBLICATIONS

English-language translation of International Preliminary Report on Patentability (IPRP) dated Nov. 27, 2014 that issued in WO Patent Application No. PCT/JP2013/057003.

*Primary Examiner* — John M Bedtelyon
(74) *Attorney, Agent, or Firm* — Drinker Biddle & Reath LLP

(57) ABSTRACT

A portion on the light exit end surface side of a fiber optic plate includes a first portion and a second portion. The first portion corresponds to a peripheral portion of a semiconductor photodetecting element. The second portion corresponds to a thin portion of the semiconductor photodetecting element and projects more toward the semiconductor photodetecting element than the first portion. A height of a step made between the first portion and the second portion of the fiber optic plate is lower than a height of a step made between the thin portion and the peripheral portion of the semiconductor photodetecting element. The semiconductor photodetecting element and the fiber optic plate are fixed by a resin, in a state in which the first portion and the peripheral portion are in contact and in which the second portion and the thin portion are separated.

5 Claims, 7 Drawing Sheets

(52) U.S. Cl.
CPC ...... *H01L27/14625* (2013.01); *H01L 31/0232* (2013.01); *H01L 31/02162* (2013.01); *H01L 2224/48091* (2013.01); *H01L 2924/10158* (2013.01)

(56) References Cited

U.S. PATENT DOCUMENTS

| | | | | |
|---|---|---|---|---|
| 7,615,414 B2 * | 11/2009 | Fritsch | ................... | G02B 6/08 250/339.02 |
| 7,696,595 B2 * | 4/2010 | Kobayashi | ............ | H01L 21/563 257/460 |
| 8,094,221 B2 * | 1/2012 | Kobayashi | ............. | G03B 17/02 348/294 |
| 2003/0122210 A1 | 7/2003 | Cohen et al. | | |
| 2006/0240586 A1 | 10/2006 | Kobayashi et al. | | |
| 2009/0261259 A1 | 10/2009 | Yip | | |
| 2015/0168568 A1 * | 6/2015 | Jonishi | ................. | G01T 1/2018 250/208.2 |
| 2015/0301196 A1 * | 10/2015 | Gubbens | ............... | G01T 1/2018 250/362 |

FOREIGN PATENT DOCUMENTS

| | | |
|---|---|---|
| JP | 2000-162724 A | 6/2000 |
| JP | 2004-134527 A | 4/2004 |

* cited by examiner

Fig.5
(a)
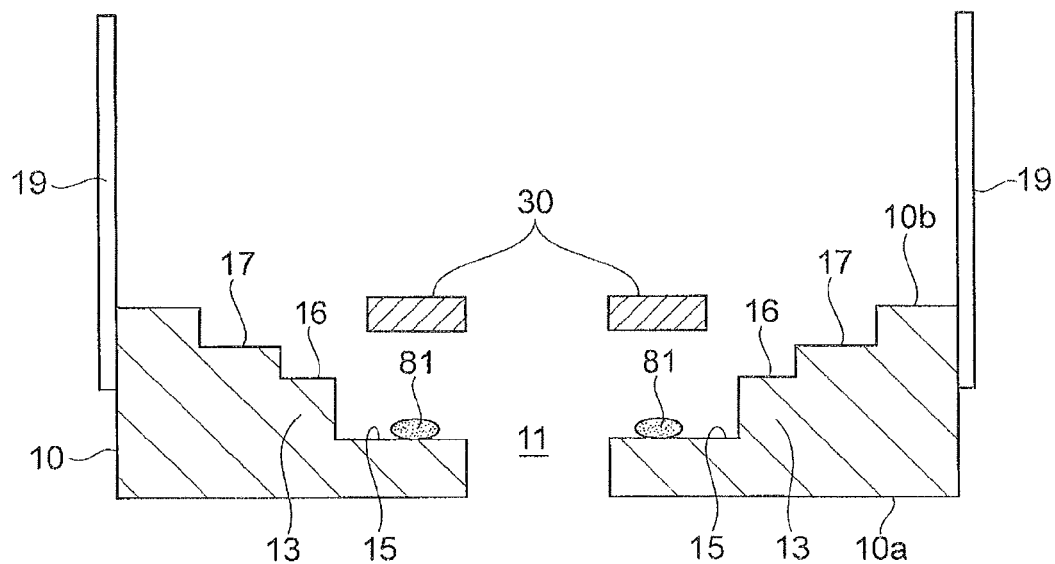
(b)
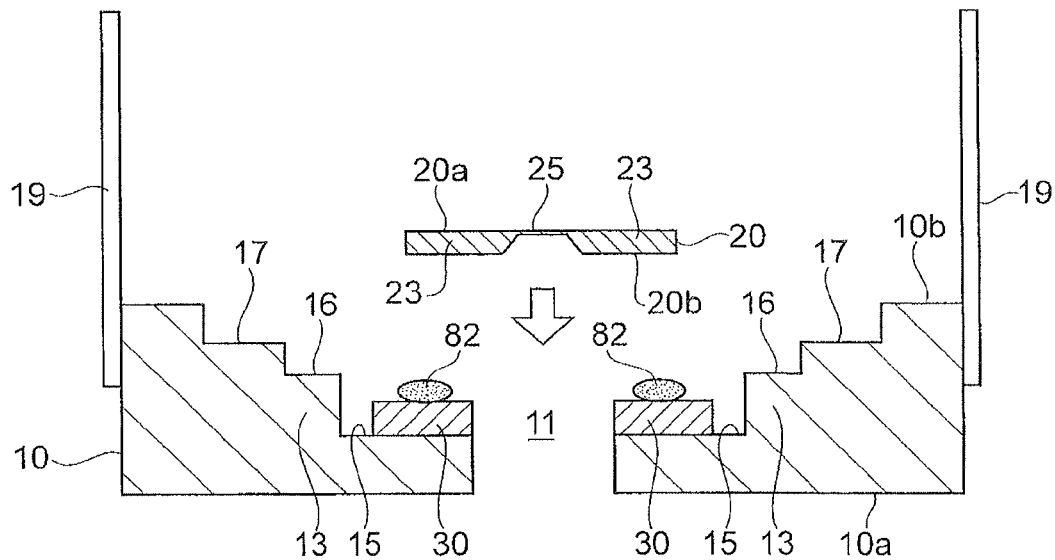

Fig.6
(a)
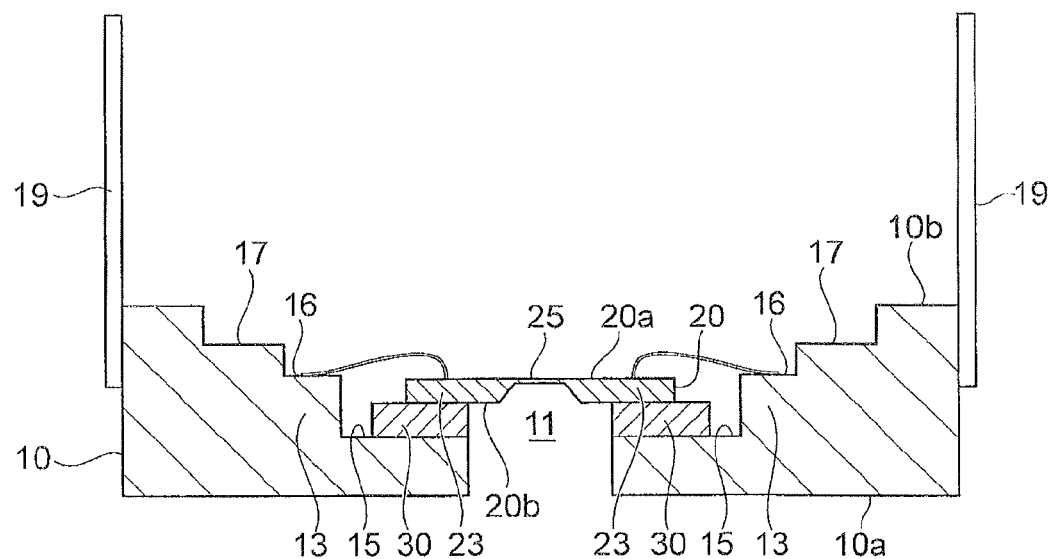
(b)
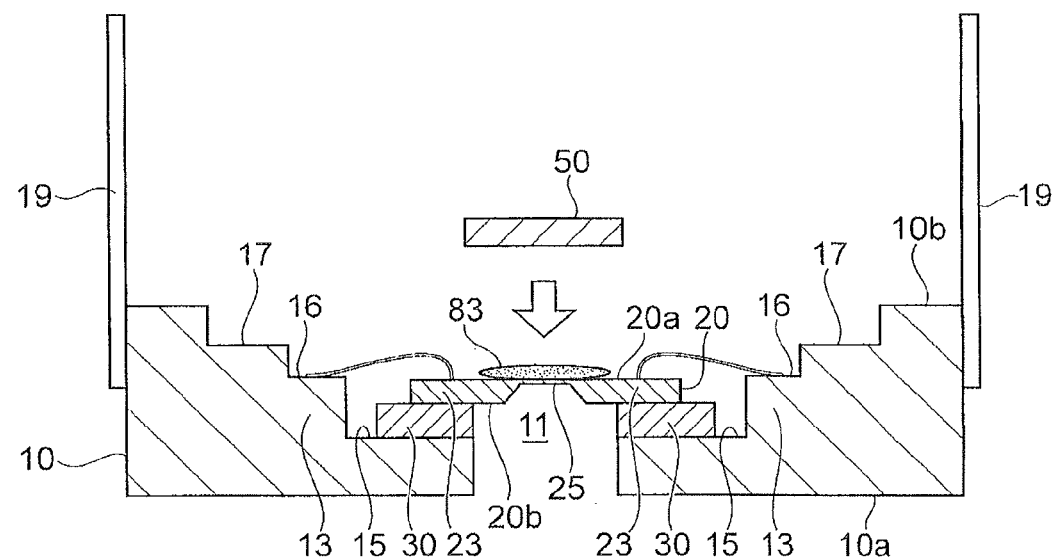

Fig.7
(a)
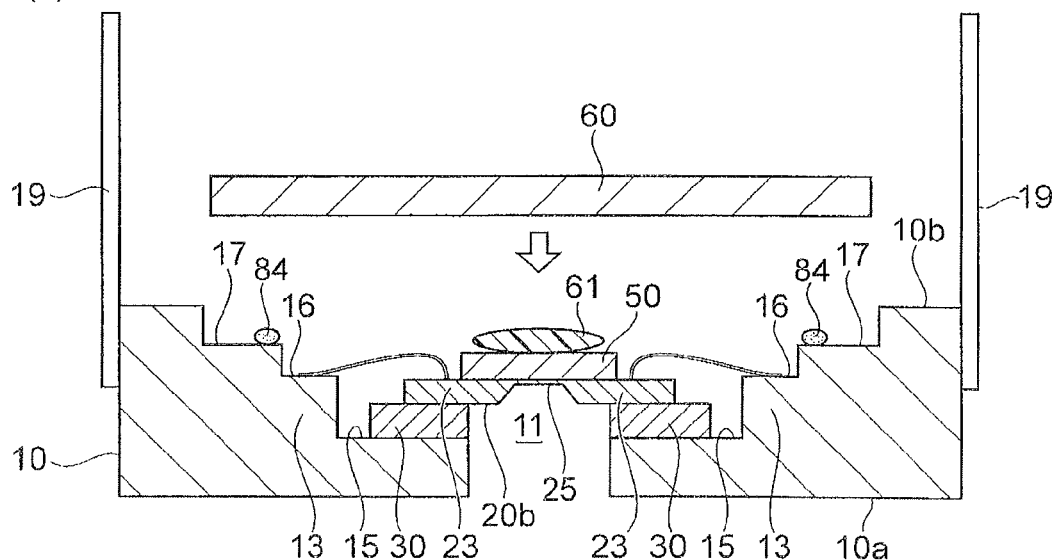
(b)
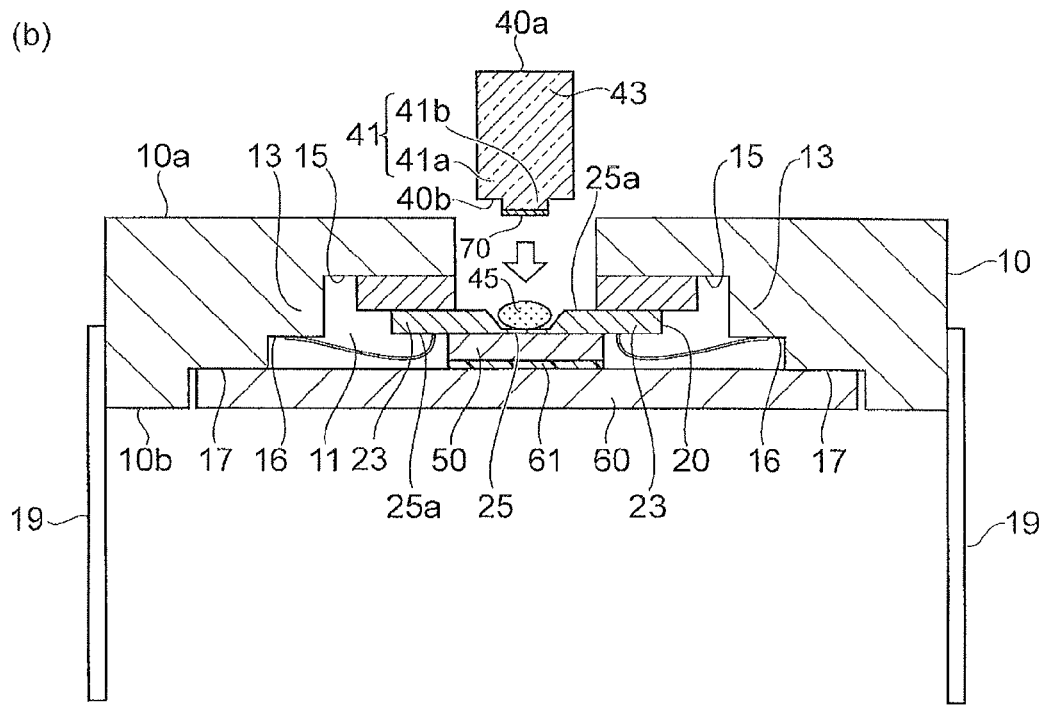

SOLID-STATE IMAGE PICKUP DEVICE

TECHNICAL FIELD

The present invention relates to a solid-state imaging device.

BACKGROUND ART

There is a known solid-state imaging device comprising: a fiber optic plate having a light incident end surface and a light exit end surface; and a semiconductor photodetecting element a light incident face of which is optically coupled to the light exit end surface of the fiber optic plate (e.g., cf. Patent Literature 1).

CITATION LIST

Patent Literature

Patent Literature 1: Japanese Patent Application Laid-Open Publication No. 2000-162724

SUMMARY OF INVENTION

Technical Problem

For improving detection sensitivity of the solid-state imaging device, we can conceivably adopt a back-illuminated semiconductor photodetecting element as the semiconductor photodetecting element. However, the solid-state imaging device configured by adopting the back-illuminated semiconductor photodetecting element can possibly have the problem as described below.

The back-illuminated semiconductor photodetecting element has a first principal surface and a second principal surface opposed to each other. The back-illuminated semiconductor photodetecting element is generally provided with a photosensitive region on the first principal surface side and a portion corresponding to the photosensitive region is thinned from the second principal surface side, while leaving a peripheral portion around the thinned portion. For this reason, in a state in which the fiber optic plate is disposed on the back-illuminated semiconductor photodetecting element, the light exit end surface of the fiber optic plate and the thinned portion in the semiconductor photodetecting element are separated from each other by a height of a step made between the thinned portion and the peripheral portion of the semiconductor photodetecting element. As the light exit end surface of the fiber optic plate is separated from the thinned portion in the semiconductor photodetecting element, light output from the light exit end surface of the fiber optic plate diffuses before the light impinges on the semiconductor photodetecting element. This diffusion leads to reduction in resolution (spatial resolving power) of the solid-state imaging device.

It is an object of the present invention to provide a solid-state imaging device capable of suppressing the reduction in resolution, even in the case where the back-illuminated semiconductor photodetecting element is adopted.

Solution to Problem

The present invention is a solid-state imaging device comprising: a back-illuminated semiconductor photodetecting element which has a first principal surface and a second principal surface opposed to each other, which is provided with a photosensitive region on the first principal surface side, and a portion of which corresponding to the photosensitive region is thinned from the second principal surface side while leaving a peripheral portion around the thinned portion; a package which has a third principal surface and a fourth principal surface opposed to each other and in which a housing space opening in the third principal surface and in the fourth principal surface and configured to house the semiconductor photodetecting element is formed; a fiber optic plate which has a light incident end surface and a light exit end surface and which is arranged so that the light exit end surface is opposed to the second principal surface; and a protective member which is fixed to the semiconductor photodetecting element from the first principal surface side and which protects the thinned portion of the semiconductor photodetecting element; a portion on the light incident end surface side of the fiber optic plate projecting from the third principal surface to the outside of the package; a portion on the light exit end surface side of the fiber optic plate including a first portion corresponding to the peripheral portion of the semiconductor photodetecting element, and a second portion corresponding to the thinned portion of the semiconductor photodetecting element and projecting more toward the semiconductor photodetecting element than the first portion: a height of a step made between the first portion and the second portion of the fiber optic plate being lower than a height of a step made between the thinned portion and the peripheral portion of the semiconductor photodetecting element; the semiconductor photodetecting element and the fiber optic plate being fixed by a resin optically transparent to light to be detected, the resin being filled between the light exit end surface and the thinned portion, in a state in which the first portion and the peripheral portion are in contact and in which the second portion and the thinned portion are separated, and the second portion of the fiber optic plate and the thinned portion of the semiconductor photodetecting element being optically coupled through the resin.

In the present invention, the portion on the light exit end surface side of the fiber optic plate includes the first portion corresponding to the peripheral portion of the semiconductor photodetecting element, and the second portion corresponding to the thinned portion of the semiconductor photodetecting element and projecting more toward the semiconductor photodetecting element than the first portion. For this reason, in a state in which the fiber optic plate is disposed on the back-illuminated semiconductor photodetecting element, the light exit end surface in the second portion of the fiber optic plate and the thinned portion of the semiconductor photodetecting element are held close to each other. Therefore, light output from the light exit end surface in the second portion of the fiber optic plate is less likely to diffuse before the light impinges on the semiconductor photodetecting element, whereby the reduction in resolution (spatial resolving power) of the solid-state imaging device can be suppressed.

The height of the step made between the first portion and the second portion of the fiber optic plate is set lower than the height of the step made between the thinned portion and the peripheral portion of the semiconductor photodetecting element. The semiconductor photodetecting element and the fiber optic plate are fixed in the state in which the first portion and the peripheral portion are in contact and in which the second portion and the thinned portion are separated. Because of these, the thinned portion in the semiconductor photodetecting element is kept out of contact with the fiber optic plate (second portion), even in the state in which the light exit end surface in the second portion of the fiber optic plate is held close to the thinned portion in the semiconductor photodetecting element. Therefore, it is feasible to prevent the thinned portion of the semiconductor photodetecting element from being damaged by contact with the fiber optic plate or the like.

The protective member is fixed to the semiconductor photodetecting element from the first principal surface side to protect the thinned portion of the semiconductor photodetecting element. This can mechanically reinforce the thinned portion in the semiconductor photodetecting element.

The semiconductor photodetecting element and the fiber optic plate are fixed by the resin optically transparent to the light to be detected, which is filled between the light exit end surface and the thinned portion. Since the resin for fixing the semiconductor photodetecting element and the fiber optic plate is filled between the light exit end surface of the fiber optic plate and the thinned portion in the semiconductor photodetecting element, a void is unlikely to be made between the light exit end surface of the fiber optic plate and the thinned portion in the semiconductor photodetecting element and, particularly, between the second portion of the fiber optic plate and the thinned portion in the semiconductor photodetecting element. Therefore, it is feasible to prevent scattering or the like of the light output from the light exit end surface in the second portion of the fiber optic plate.

A wavelength-selective filter may be arranged on a surface of the second portion of the fiber optic plate, the surface being opposed to the thinned portion of the semiconductor photodetecting element, and the semiconductor photodetecting element and the fiber optic plate may be fixed in a state in which the wavelength-selective filter and the thinned portion are separated. In this case, the wavelength-selective filter is kept out of contact with the thinned portion in the semiconductor photodetecting element, even in a state in which the wavelength-selective filter is held close to the thinned portion in the semiconductor photodetecting element. Therefore, it is feasible to prevent either of the thinned portion of the semiconductor photodetecting element and the wavelength-selective filter from being damaged by contact of the wavelength-selective filter or the like.

The semiconductor photodetecting element may be fixed through a base to the package. In this case, the semiconductor photodetecting element can be accurately fixed.

The device may further comprise a lid member which closes the housing space from the fourth principal surface side and which is fixed to the protective member, and the protective member and the lid member may be thermally coupled. In this case, heat generated in the semiconductor photodetecting element is dissipated through the protective member and the lid member. Therefore, heat dissipation capability can be enhanced.

The protective member and the lid member may be fixed with an adhesive containing a resin and a filler comprised of a material with a thermal conductivity higher than that of the resin. In this case, the heat dissipation capability can be further enhanced.

Advantageous Effect of Invention

The present invention provides the solid-state imaging device capable of suppressing the reduction in resolution, even in the case where the back-illuminated semiconductor photodetecting element is adopted.

BRIEF DESCRIPTION OF DRAWINGS

FIG. 5 is a drawing for explaining a process for manufacturing the solid-state imaging device according to the present embodiment.
FIG. 6 is a drawing for explaining the process for manufacturing the solid-state imaging device according to the present embodiment.
FIG. 7 is a drawing for explaining the process for manufacturing the solid-state imaging device according to the present embodiment.

DESCRIPTION OF EMBODIMENTS

The preferred embodiments of the present invention will be described below in detail with reference to the accompanying drawings. In the description the same elements or elements with the same functionality will be denoted by the same reference signs, without redundant description.

Figure 1:
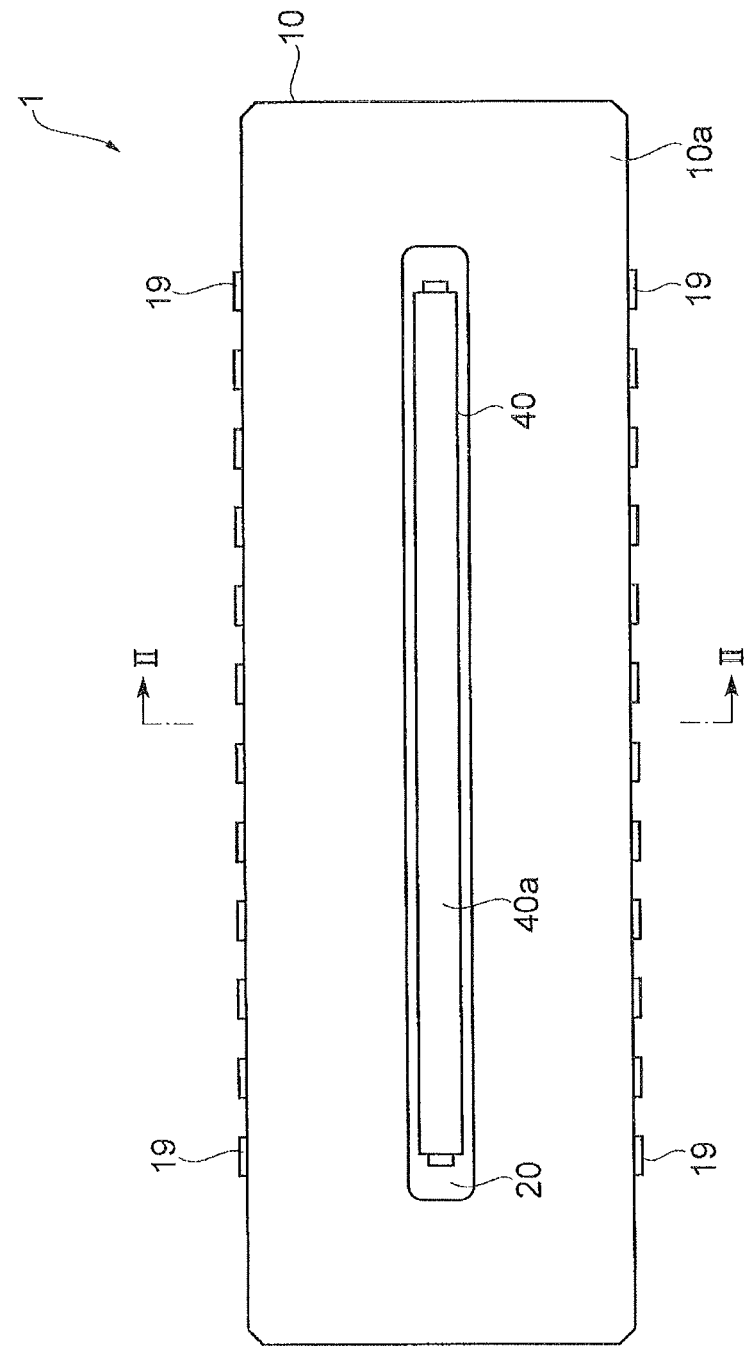
FIG. 1 is a plan view showing a solid-state imaging device according to a present embodiment.
Figure 2:
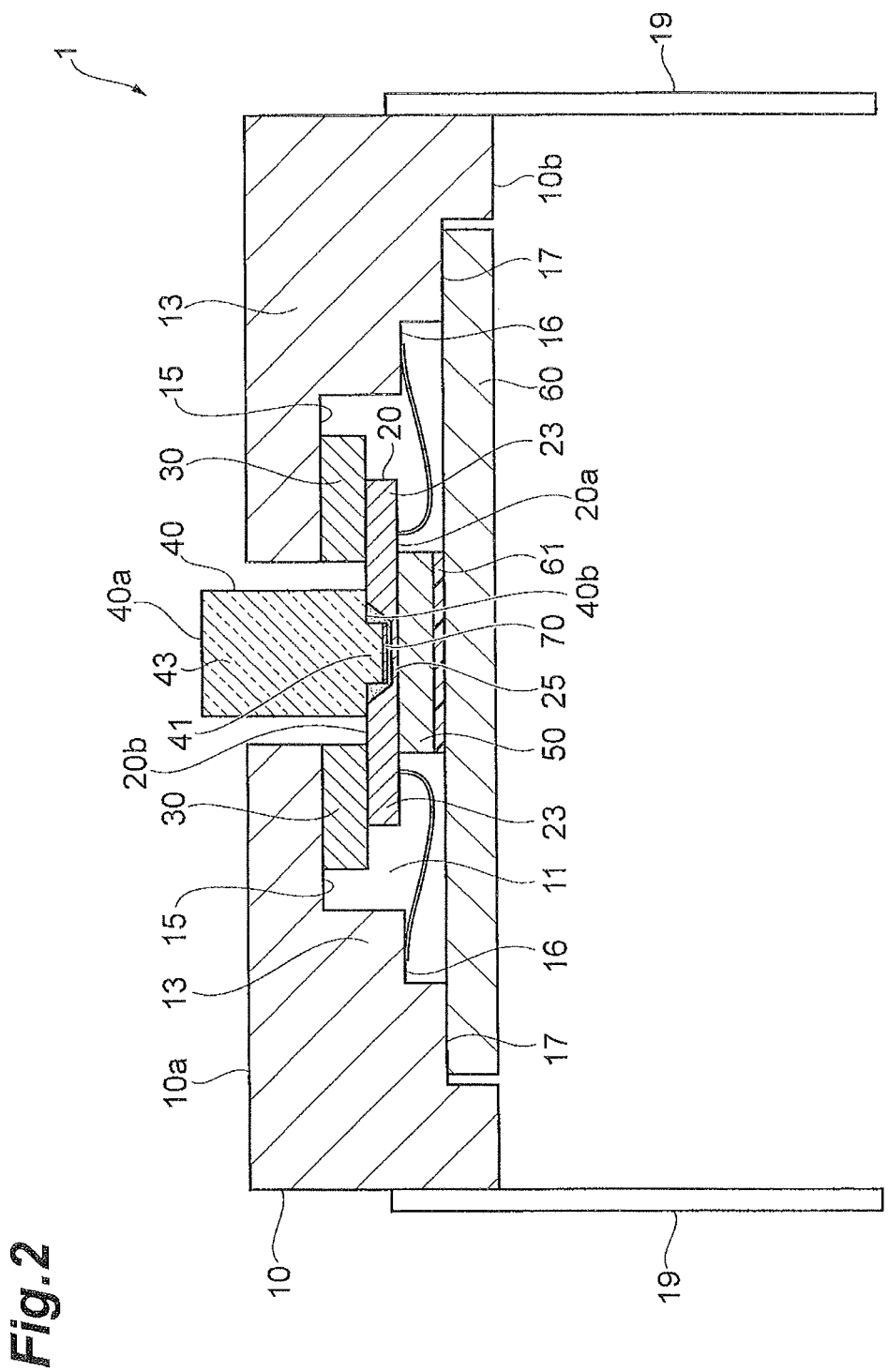
FIG. 2 is a drawing for explaining a cross-sectional configuration along the line II-II in FIG. 1.
Figure 3:
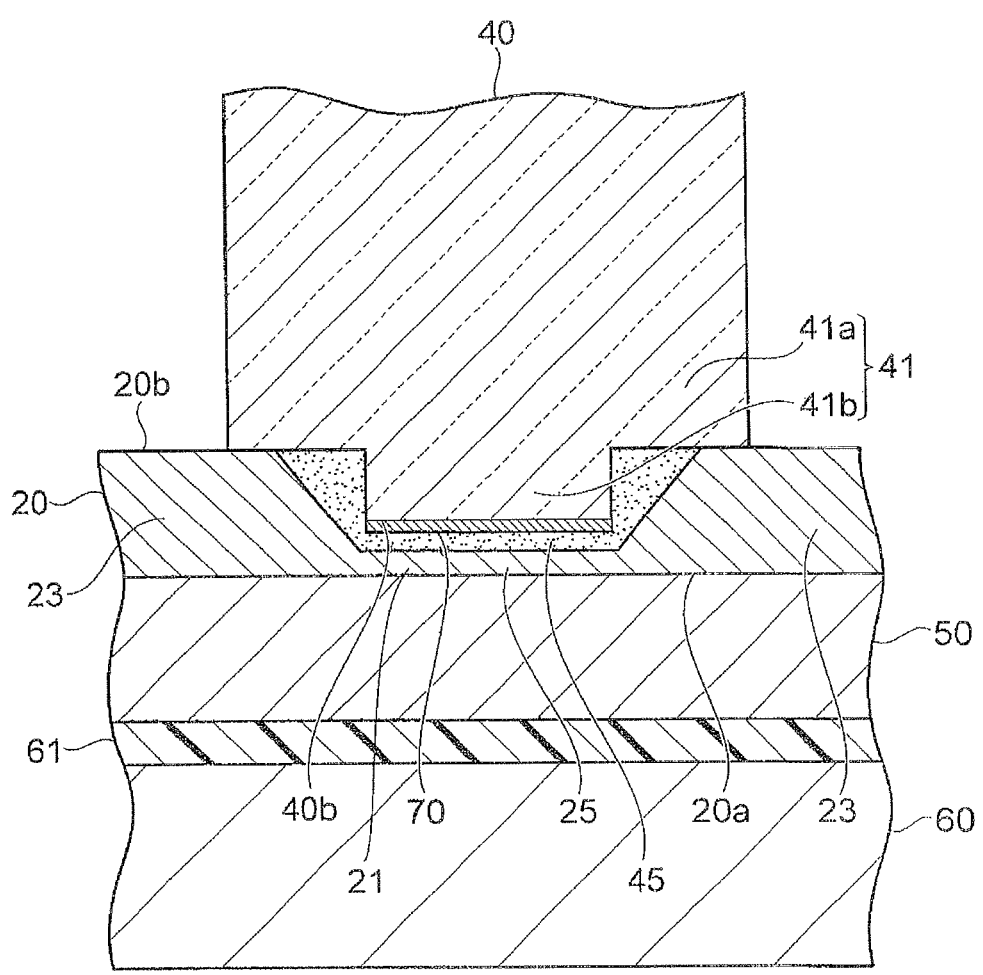
FIG. 3 is a drawing for explaining a cross-sectional configuration of a semiconductor photodetecting element and a fiber optic plate.
Figure 4:
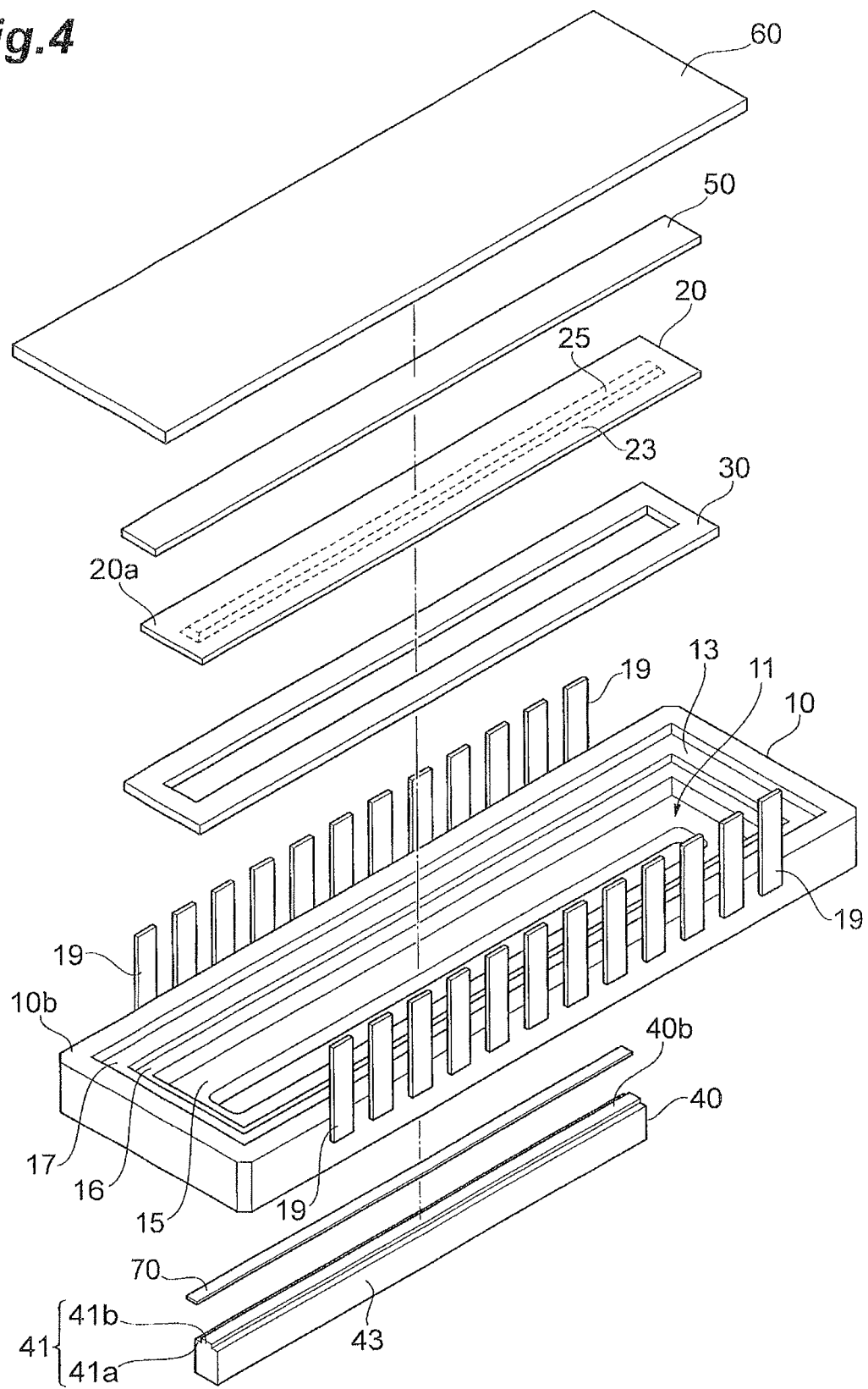
FIG. 4 is an exploded perspective view showing the configuration of the solid-state imaging device according to the present embodiment.

First, a configuration of a solid-state imaging device 1 according to a present embodiment will be described with reference to FIGS. 1 to 4. FIG. 1 is a plan view showing the solid-state imaging device according to the present embodiment. FIG. 2 is a drawing for explaining a cross-sectional configuration along the line II-II in FIG. 1. FIG. 3 is a drawing for explaining a cross-sectional configuration of a semiconductor photodetecting element and a fiber optic plate. FIG. 4 is an exploded perspective view showing the configuration of the solid-state imaging device according to the present embodiment.

As shown in FIGS. 1 to 4, the solid-state imaging device 1 has a package 10, a back-illuminated semiconductor photodetecting element 20, a base 30, a fiber optic plate 40, a protective member 50, and a lid member 60. The solid-state imaging device 1 can be used in a radiological image reading device for an imaging plate. The radiological image reading device for the imaging plate is configured to irradiate the imaging plate with excitation light and detect light radiated from the imaging plate. The wavelength of the light (light to be detected) radiated from the imaging plate is different from that of the excitation light.

The package 10 has a principal surface 10a and a principal surface 10b opposed to each other, and is comprised of a ceramic material. In the present embodiment, the package 10 is made of alumina. A hollow portion 11 extending in a predetermined direction in the package 10 is formed in a central region of the package 10. The package 10 has a nearly rectangular shape on the plan view and the hollow portion 11 extends in the longitudinal direction of the package 10.

The hollow portion 11 opens in the principal surface 10a and in the principal surface 10b. An opening in the principal surface 10a has a nearly rectangular shape on the plan view and extends in the longitudinal direction of the package 10. The hollow portion 11 functions as a housing space for housing the semiconductor photodetecting element 20. In the package 10, a mount portion 13 for mounting of the semiconductor photodetecting element 20 is provided so as to project into the hollow portion 11.

The mount portion 13 has a first plane 15 for the semiconductor photodetecting element 20 to be disposed thereon, a second plane 16 on which electrode pads (not shown) are arranged, and a third plane 17 to which the lid member 60 is fixed. The first, second, and third planes 15, 16, 17 are opposed to the principal surface 10a and are formed in a step-like shape in the order of the third plane 17, the second plane 16, and the first plane 15 from the principal surface 10b side. Namely, a step is made between the principal surface 10b and the third plane 17, a step is made between the third plane 17 and the second plane 16, and a step is made between the second plane 16 and the first plane 15.

A plurality of electrode pins 19 for external connection are arranged on each of two side faces of the package 10. The electrode pins 19 are electrically connected to the corresponding electrode pads through wires arranged in the package 10.

The semiconductor photodetecting element 20 has a principal surface 20a and a principal surface 20b opposed to each other and is provided with a photosensitive region 21 on the principal surface 20a side. The photosensitive region 21 generates electric charge according to incident light. In the present embodiment, a BT (Back-illuminated Thinning)-CCD (Charge Coupled Device) is used as the semiconductor photodetecting element 20. The generated charge is transferred as signal charge by a shift register, and is output after converted into a voltage corresponding to the signal charge. For the semiconductor photodetecting element 20, the charge transfer is carried out by TDI (Time Delay Integration) operation. Each electrode pad (not shown) of the semiconductor photodetecting element 20 is electrically connected through a bonding wire to the corresponding electrode pad of the package 10.

In the semiconductor photodetecting element 20 a portion corresponding to the photosensitive region 21 is thinned from the principal surface 20b side while leaving a peripheral portion 23 around the thinned portion. Namely, the portion corresponding to the photosensitive region 21 is a thinned portion (thin portion) 25. Thinning of the semiconductor photodetecting element 20 can be implemented, for example, as follows. A silicon nitride film is deposited on the principal surface 20b of a silicon substrate forming the semiconductor photodetecting element 20, and the silicon nitride film is patterned in a desired shape by a photolithography step. A region corresponding to the peripheral portion 23 is covered by the silicon nitride film and a portion corresponding to the photosensitive region 21 is exposed. After that, the silicon substrate is etched with an etching solution (e.g., KOH or the like), while the region covered by the silicon nitride film (the region corresponding to the peripheral portion 23) is left thick.

The semiconductor photodetecting element 20 is mounted on the first plane 15 of the mount portion 13 through the base 30 so that the principal surface 20b side is a light incident surface, and is fixed to the mount portion 13 (package 10). The semiconductor photodetecting element 20 is arranged in the package 10 so that the thin portion 25 of the semiconductor photodetecting element 20 faces the opening of the principal surface 10a. The thin portion 25 extends in the longitudinal direction of the opening of the principal surface 10a, corresponding to the opening of the principal surface 10a.

A through hole corresponding to the opening of the principal face 10a is formed in the base 30. The base 30 is comprised of a ceramic material with the coefficient of thermal expansion in a predetermined temperature range larger than that of the semiconductor photodetecting element 20 (silicon). In the present embodiment, the base 30 is made of alumina. The base 30 is fixed to the package 10 with an adhesive (not shown). The principal surface 20b side of the peripheral portion 23 of the semiconductor photodetecting element 20 is fixed to the base 30 with an adhesive (not shown).

The fiber optic plate 40 has a light incident end surface 40a and a light exit end surface 40b. The fiber optic plate 40 is arranged so that the light exit end surface 40b is opposed to the principal surface 20b of the semiconductor photodetecting element 20. The fiber optic plate 40 has a nearly rectangular shape on the plan view and the longitudinal direction thereof agrees with the longitudinal direction of the opening of the principal surface 10a.

A portion 41 on the light exit end surface 40b side of the fiber optic plate 40, as also shown in FIG. 3, includes a first portion 41a and a second portion 41b. The first portion 41a is located so as to correspond to the peripheral portion 23 of the semiconductor photodetecting element 20. The second portion 41b is located so as to correspond to the thin portion 25 of the semiconductor photodetecting element 20. The second portion 41b projects more toward the semiconductor photodetecting element 20 than the first portion 41a. Namely, the light exit end surface 40b has a step made between the first portion 41a and the second portion 41b. The height of the step made between the first portion 41a and the second portion 41b of the fiber optic plate 40 is set lower than the height of the step made between the thin portion 25 and the peripheral portion 23 of the semiconductor photodetecting element 20.

A wavelength-selective filter 70 is arranged on a face in the second portion 41b of the fiber optic plate 40 (the light exit end surface 40b of the second portion 41b) opposed to the thin portion 25 of the semiconductor photodetecting element 20. The wavelength-selective filter 70 is, for example, a dielectric multilayer filter. The dielectric multilayer filter can be formed by evaporation or the like on the light exit end surface 40b of the second portion 41b of the fiber optic plate 40.

In the radiological image reading device for the imaging plate, it is necessary to separate the excitation light and the light to be detected, from each other so as to prevent the excitation light irradiating the imaging plate, from entering the semiconductor photodetecting element 20. The wavelength-selective filter 70 separates the excitation light and the light to be detected and allows only the light to be detected, to enter the semiconductor photodetecting element 20.

The semiconductor photodetecting element 20 and the fiber optic plate 40 are fixed by a resin 45. In a state in which the fiber optic plate 40 is fixed to the semiconductor photodetecting element 20, the first portion 41a is in contact with the peripheral portion 23 and the wavelength-selective filter 70 (second portion 41b) is separated from the thin portion 25. The resin 45 is optically transparent to the light to be detected. The resin 45 is filled in a space between the light exit end surface 40b of the fiber optic plate 40 and the wavelength-selective filter 70, and the thin portion 25 of the semiconductor photodetecting element 20. Because of this, the wavelength-selective filter 70 (the second portion 41b of the fiber optic plate 40) is optically coupled to the thin portion 25 of the semiconductor photodetecting element 20 through the resin 45. In the present embodiment, the resin 45 to be used is a transparent silicone resin.

In a state in which the fiber optic plate 40 is fixed to the semiconductor photodetecting element 20, a portion 43 on the light incident end surface 40a side of the fiber optic plate 40 projects from the principal surface 10a of the package 10 to the outside of the package 10. The fiber optic plate 40 is not directly fixed to the package 10 but fixed to the package 10 through the semiconductor photodetecting element 20 and the base 30. Therefore, a predetermined gap is made between the fiber optic plate 40 and the package 10.

The distance between the second portion 41b of the fiber optic plate 40 and the thin portion 25 of the semiconductor photodetecting element 20 is set larger than the thickness of the wavelength-selective filter 70. Namely, the height of the step made between the thin portion 25 and the peripheral portion 23 of the semiconductor photodetecting element 20 is set higher than a value resulting from addition of the height of the step made between the first portion 41a and the second portion 41b of the fiber optic plate 40 to the thickness of the wavelength-selective filter 70. Therefore, in the state in which the first portion 41a is in contact with the peripheral portion 23, the semiconductor photodetecting element 20 and the wavelength-selective filter 70 are separated.

The protective member 50 is fixed to the semiconductor photodetecting element 20 from the principal surface 20a side. The protective member 50 protects the thin portion 25 of the semiconductor photodetecting element 20. The protective member 50 has a nearly rectangular shape on the plan view and the longitudinal direction thereof is the longitudinal direction of the thin portion 25. The protective member 50 is comprised, for example, of a sapphire substrate or the like. The protective member 50 is fixed to the semiconductor photodetecting element 20 with an adhesive (not shown).

The lid member 60 closes the hollow portion 11 from the principal surface 10b. An edge region of the lid member 60 is fixed to the third plane 17 of the mount portion 13. The lid member 60 is comprised of a ceramic material. In the present embodiment, the lid member 60 is made of alumina. The lid member 60 is fixed to the package 10 (third plane 17) with an adhesive (not shown). The lid member 60 is also fixed to the protective member 50. Because of this, the protective member 50 and the lid member 60 are thermally coupled. The lid member 60 is fixed to the protective member 50 with an adhesive 61. The adhesive 61 contains a resin (e.g., epoxy resin or the like) and a filler made of a material with the thermal conductivity higher than that of the resin (e.g., alumina or the like).

The below will describe a process for manufacturing the solid-state imaging device 1 having the above-described configuration, with reference to FIGS. 5 to 7. FIGS. 5 to 7 are drawings for explaining the process for manufacturing the solid-state imaging device according to the present embodiment.

First, the package 10 and the base 30 are prepared and the base 30 is fixed to the package 10 (first plane 15) with an adhesive 81 (cf. (a) in FIG. 5). The adhesive 81 to be used herein is, for example, an epoxy resin containing Ag powder as filler.

Next, the semiconductor photodetecting element 20 prepared is fixed to the base 30 with an adhesive 82 (cf. (b) in FIG. 5). The adhesive 82 to be used herein is, for example, an epoxy resin containing Ag powder as filler. The base 30 is prepared so that the face to be fixed to the package 10 and the face for the semiconductor photodetecting element 20 to be fixed thereto are flattened by mechanical processing (e.g., chemical mechanical polishing or the like). By this, the mount surface for the semiconductor photodetecting element 20 is properly defined.

Next, the electrode pads (not shown) of the semiconductor photodetecting element 20 and the electrode pads (not shown) of the package 10 in correspondence are connected by wire bonding (cf. (a) in FIG. 6).

Next, the protective member 50 prepared is fixed to the principal surface 20a of the semiconductor photodetecting element 20 with an adhesive 83 (cf. (b) in FIG. 6). The adhesive 83 to be used herein is, for example, an epoxy resin. In curing the adhesive 83, the temperature is raised to the aforementioned predetermined temperature range. This brings the thin portion 25 of the semiconductor photodetecting element 20 into a flattened state because of the difference of thermal expansion coefficient between the semiconductor photodetecting element 20 and the base 30 and, while the flattened state is maintained, the protective member 50 becomes fixed to the semiconductor photodetecting element 20.

Next, the lid member 60 prepared is fixed to the protective member 50 and the package 10 (third plane 17) with adhesives 61, 84 (cf. (a) in FIG. 7). The adhesive 61 to be used herein is, for example, the aforementioned epoxy resin containing the alumina filler. Curing of the adhesive 61 is carried out in a temperature range lower than the aforementioned predetermined temperature range. The adhesive 84 to be used herein for fixing the lid member 60 and the package 10 is, for example, an epoxy resin.

Next, the fiber optic plate 40 prepared is fixed to the semiconductor photodetecting element 20 by the resin 45 (cf. (b) in FIG. 7). In the fiber optic plate 40 the wavelength-selective filter 70 is formed on the light exit end surface 40b of the second portion 41b. The resin 45 to be used herein is a transparent silicone resin. This silicone resin is cured at room temperature.

The solid-state imaging device 1 having the aforementioned configuration is obtained by the these manufacturing processes.

In the present embodiment, as described above, the portion 41 on the light exit end surface 40b side of the fiber optic plate 40 includes the first portion 41a and the second portion 41b. The wavelength-selective filter 70 is arranged on the light exit end surface 40b in the second portion 41b of the fiber optic plate 40. For this reason, in the state in which the fiber optic plate 40 is disposed on the semiconductor photodetecting element 20, the wavelength-selective filter 70 (the light exit end surface 40b in the second portion 41b) and the thin portion 25 of the semiconductor photodetecting element 20 are held close to each other. Therefore, light output from the wavelength-selective filter 70 is less likely to diffuse before the light impinges on the semiconductor photodetecting element 20, whereby the reduction in resolution (spatial resolving power) of the solid-state imaging device 1 can be suppressed.

The height of the step made between the first portion 41a and the second portion 41b of the fiber optic plate 40 is set lower than a value resulting from subtraction of the thickness of the wavelength-selective filter 70 from the height of the step made between the thin portion 25 and the peripheral 23 of the semiconductor photodetecting element 20. The semiconductor photodetecting element 20 and the fiber optic plate 40 are fixed in the state in which the first portion 41a and the peripheral portion 23 are in contact and in which the wavelength-selective filter 70 (second portion 41b) and the thin portion 25 are separated. Because of these, no contact is made between the thin portion 25 of the semiconductor photodetecting element 20 and the wavelength-selective filter 70, even in the state in which the wavelength-selective filter 70 is held close to the thin portion 25 of the semiconductor photodetecting element 20. Therefore, it is feasible to prevent either of the thin portion 25 of the semiconductor photodetecting element 20 and the wavelength-selective filter 70 from being damaged by contact of the wavelength-selective filter or the like.

The protective member 50 is fixed to the semiconductor photodetecting element 20 from the principal surface 20a side to protect the thin portion 25 of the semiconductor photodetecting element 20. This can mechanically reinforce the thin portion 25 of the semiconductor photodetecting element 20. In the state in which the protective member 50 is fixed to the semiconductor photodetecting element 20, the flattened state of the thin portion 25 of the semiconductor photodetecting element 20 is maintained. For this reason, it is feasible to prevent the distance between the wavelength-selective filter 70 (the light exit end surface 40b in the second portion 41b) and the thin portion 25 of the semiconductor photodetecting element 20 from varying depending upon locations, and thereby prevent occurrence of variation in resolution.

The semiconductor photodetecting element 20 and the fiber optic plate 40 are fixed by the resin 45 filled in the space between the light exit end surface 40b of the fiber optic plate 40 and the wavelength-selective filter 70, and the thin portion 25 of the semiconductor photodetecting element 20. Since the resin 45 is filled between the light exit end surface 40b of the fiber optic plate 40 and the wavelength-selective filter 70, and the thin portion 25 of the semiconductor photodetecting element 20, a void is less likely to be made between the light exit end surface 40b of the fiber optic plate 40 and the thin portion 25 of the semiconductor photodetecting element 20 and, particularly, between the wavelength-selective filter 70 and the thin portion 25. Therefore, it can prevent scattering or the like of the light output from the wavelength-selective filter 70.

The semiconductor photodetecting element 20 is fixed to the package 10 through the base 30. Because of this, the semiconductor photodetecting element 20 can be accurately fixed to the package 10.

The lid member 60 to close the hollow portion 11 from the principal surface 10b is fixed to the protective member 50 and is thermally coupled to the protective member 50. Because of this, heat generated in the semiconductor photodetecting element 20 is dissipated through the protective member 50 and the lid member 60, thus enhancing the heat dissipation capability.

The protective member 50 and the lid member 60 are fixed with the adhesive 61 containing the resin and the filler made of the material with the thermal conductivity higher than that of the resin. Because of this, the heat dissipation capability can be further enhanced.

The above described the preferred embodiment of the present invention but it should be noted that the present invention is not always limited to the above embodiment and can be modified in many ways without departing from the scope and spirit of the invention.

The solid-state imaging device 1 of the present embodiment cannot be used only in the radiological image reading device for the imaging plate but can also be used in a spectral device or the like.

The wavelength-selective filter 70 does not have to be placed if it is unnecessary to select the light entering the semiconductor photodetecting element 20. In this case, the height of the step made between the first portion 41a and the second portion 41b of the fiber optic plate 40 needs only to be set lower than the height of the step made between the thin portion 25 and the peripheral portion 23 of the semiconductor photodetecting element 20. This can prevent the thin portion 25 of the semiconductor photodetecting element 20 from being damaged.

INDUSTRIAL APPLICABILITY

The present invention can be applied to the solid-state imaging devices used in the radiological image reading apparatus for the imaging plate.

REFERENCE SIGNS LIST 1 solid-state imaging device; 10 package; 10a, 10b principal surfaces; 11 hollow portion; 20 semiconductor photodetecting element; 20a, 20b principal surfaces; 21 photosensitive region; 23 peripheral portion; 25 thin portion; 30 base; 40 fiber optic plate; 40a light incident end surface; 40b light exit end surface; 41 portion on the light exit end surface side; 41a first portion; 41b second portion; 43 portion on the light incident end surface side; 45 resin; 50 protective member; 60 lid member; 61 adhesive; 70 wavelength-selective filter.

The invention claimed is:

1. A solid-state imaging device comprising:
a back-illuminated semiconductor photodetecting element which has a first principal surface and a second principal surface opposed to each other, which is provided with a photosensitive region on the first principal surface side, and a portion of which corresponding to the photosensitive region is thinned from the second principal surface side while leaving a peripheral portion around the thinned portion;
a package which has a third principal surface and a fourth principal surface opposed to each other and in which a housing space opening in the third principal surface and in the fourth principal surface and configured to house the semiconductor photodetecting element is formed;
a fiber optic plate which has a light incident end surface and a light exit end surface and which is arranged so that the light exit end surface is opposed to the second principal surface; and
a protective member which is fixed to the semiconductor photodetecting element from the first principal surface side and which protects the thinned portion of the semiconductor photodetecting element,
wherein a portion on the light incident end surface side of the fiber optic plate projects from the third principal surface to the outside of the package,
wherein a portion on the light exit end surface side of the fiber optic plate includes a first portion corresponding to the peripheral portion of the semiconductor photodetecting element, and a second portion corresponding to the thinned portion of the semiconductor photodetecting element and projecting more toward the semiconductor photodetecting element than the first portion,
wherein a height of a step made between the first portion and the second portion of the fiber optic plate is lower than a height of a step made between the thinned portion and the peripheral portion of the semiconductor photodetecting element,
wherein the semiconductor photodetecting element and the fiber optic plate are fixed by a resin optically transparent to light to be detected, the resin being filled between the light exit end surface and the thinned portion, in a state in which the first portion and the peripheral portion are in contact and in which the second portion and the thinned portion are separated, and
wherein the second portion of the fiber optic plate and the thinned portion of the semiconductor photodetecting element are optically coupled through the resin.

2. The solid-state imaging device according to claim 1, wherein a wavelength-selective filter is arranged on a surface of the second portion of the fiber optic plate, the surface being opposed to the thinned portion of the semiconductor photodetecting element, and
wherein the semiconductor photodetecting element and the fiber optic plate are fixed in a state in which the wavelength-selective filter and the thinned portion are separated.

3. The solid-state image capture device according to claim 1,
wherein the semiconductor photodetecting element is fixed through a base to the package.

4. The solid-state imaging device according to claim 1, further comprising:
a lid member which closes the housing space from the fourth principal surface side and which is fixed to the protective member,
wherein the protective member and the lid member are thermally coupled.

5. The solid-state imaging device according to claim 4,
wherein the protective member and the lid member are fixed with an adhesive containing a resin and a filler comprised of a material with a thermal conductivity higher than that of the resin.

* * * * *